United States Patent
Chen et al.

(10) Patent No.: US 8,816,379 B2
(45) Date of Patent: *Aug. 26, 2014

(54) REFLECTION CURVED MIRROR STRUCTURE OF A VERTICAL LIGHT-EMITTING DIODE

(71) Applicant: High Power Opto. Inc., Taichung (TW)

(72) Inventors: Fu-Bang Chen, Taichung (TW); Wei-Yu Yen, Taichung (TW); Li-Ping Chou, Taichung (TW); Wei-Chun Tseng, Taichung (TW); Chih-Sung Chang, Taichung (TW)

(73) Assignee: High Power Opto, Inc., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/938,875

(22) Filed: Jul. 10, 2013

(65) Prior Publication Data
US 2013/0307009 A1    Nov. 21, 2013

Related U.S. Application Data

(63) Continuation-in-part of application No. 13/474,350, filed on May 17, 2012, now Pat. No. 8,546,831.

(51) Int. Cl.
| H01L 33/10 | (2010.01) |
| H01L 33/40 | (2010.01) |
| H01L 33/58 | (2010.01) |
| H01L 33/20 | (2010.01) |
| H01L 33/38 | (2010.01) |

(52) U.S. Cl.
CPC .............. *H01L 33/58* (2013.01); *H01L 33/405* (2013.01); *H01L 33/20* (2013.01); *H01L 33/387* (2013.01)

USPC ..................................... 257/98; 257/E33.068

(58) Field of Classification Search
USPC .................................................. 257/E33.012
See application file for complete search history.

(56) References Cited

U.S. PATENT DOCUMENTS

| 6,781,160 | B1 | 8/2004 | Tsai et al. | |
|---|---|---|---|---|
| 7,615,798 | B2 * | 11/2009 | Sanga et al. ................... | 257/99 |
| 7,888,696 | B2 | 2/2011 | Kang | |
| 2005/0184297 | A1 | 8/2005 | Hsieh | |
| 2008/0142824 | A1 | 6/2008 | Chen et al. | |
| 2009/0261376 | A1 | 10/2009 | Hwang | |
| 2009/0272993 | A1 | 11/2009 | Cheong | |
| 2010/0019268 | A1 | 1/2010 | Illek | |
| 2010/0052010 | A1 | 3/2010 | Yoon | |
| 2010/0065881 | A1 | 3/2010 | Kim | |
| 2010/0127303 | A1 | 5/2010 | Hwang et al. | |
| 2010/0187554 | A1 | 7/2010 | Jang et al. | |

(Continued)

*Primary Examiner* — Stephen W Smoot
(74) *Attorney, Agent, or Firm* — Muncy, Geissler, Olds & Lowe, P.C.

(57) ABSTRACT

A reflection curved mirror structure is applied to a vertical light-emitting diode (LED) which includes a P-type electrode, a permanent substrate, a binding layer, a buffer layer, a mirror layer, a P-type semiconductor layer, a light-emitting layer, an N-type semiconductor layer and an N-type electrode that are stacked in sequence. Between the P-type semiconductor layer and the mirror layer is a filler. The filler is located right below the N-type electrode to form a protruding curved surface facing the light-emitting layer. The mirror layer forms a mirror structure along the protruding curved surface. With reflection provided by the mirror structure, excited light from the light-emitting layer is reflected towards two sides, so that the excited light can dodge the N-type electrode without being shielded to increase light extraction efficiency.

13 Claims, 8 Drawing Sheets

(56) References Cited

U.S. PATENT DOCUMENTS

| | | |
|---|---|---|
| 2010/0213481 A1 | 8/2010 | Hwang |
| 2010/0314642 A1 | 12/2010 | Kudo et al. |
| 2011/0057223 A1 | 3/2011 | Hwang |
| 2011/0057224 A1 | 3/2011 | Hwang |
| 2011/0095322 A1 | 4/2011 | Kang |
| 2011/0108869 A1 | 5/2011 | Hwang |
| 2011/0108872 A1 | 5/2011 | Kim |
| 2011/0156070 A1 | 6/2011 | Yoon et al. |
| 2011/0212559 A1 | 9/2011 | Ohmae et al. |
| 2011/0215358 A1 | 9/2011 | Hwang et al. |
| 2011/0241050 A1 | 10/2011 | Ye et al. |
| 2012/0086038 A1 | 4/2012 | Hwang |
| 2012/0119243 A1 | 5/2012 | Kim et al. |
| 2012/0326187 A1 | 12/2012 | Odnoblyudov et al. |

\* cited by examiner

US 8,816,379 B2

REFLECTION CURVED MIRROR STRUCTURE OF A VERTICAL LIGHT-EMITTING DIODE

This application is a continuation-in-part, and claims priority, of from U.S. patent application Ser. No. 13/474,350 filed on May 17, 2012, which issued on Oct. 1, 2013 as U.S. Pat. No. 8,546,831, entitled "REFLECTION CONVEX MIRROR STRUCTURE OF A VERTICAL LIGHT-EMITTING DIODE", the entire contents of which are hereby incorporated by reference.

FIELD OF THE INVENTION

The present invention relates to a light-emitting diode (LED), and particularly to an LED structure capable of increasing light extraction efficiency.

BACKGROUND OF THE INVENTION

FIG. 1 shows a conventional vertical LED. The conventional vertical LED includes a sandwich structure formed by an N-type semiconductor layer 1, a light-emitting layer 2 and a P-type semiconductor layer 3. Below the P-type semiconductor layer 3, a mirror layer 4, a buffer layer 5, a binding layer 6, a silicon substrate 7 and a P-type electrode 8 are disposed in sequence. A surface of the N-type semiconductor layer 1 is processed by a roughening treatment for increasing an optical emission rate. An N-type electrode 9 is further disposed on the roughened surface of the N-type semiconductor layer 1.

By applying a voltage between the N-type electrode 9 and the P-type electrode 8, the N-type semiconductor layer 1 is enabled to provide electrons and the P-type semiconductor layer 3 is enabled to provide holes. Light is produced by the electrons and holes combining at the light-emitting layer 2 to further generate excited light through energy level jump.

Again referring to FIG. 1, a region right below the N-type electrode 9 has a highest current density, and so a main light-emitting region of the light-emitting layer 2 falls right below the N-type electrode 9. However, since the N-type electrode 9 is opaque and occupies 10% to 23% of an overall area of the LED and the main light-emitting region is right below the N-type electrode 9, a substantial ratio of excited light 2A is shielded. As a result, the loss of the excited light may reach as high as 15% to 38% such that light extraction efficiency suffers.

Referring to FIG. 2, to, increase the light extraction efficiency, a current blocking layer 3A is often disposed between the P-type semiconductor layer 3 and the mirror layer 4. The current blocking layer 3A is disposed right below the N-type electrode 9, inferring to that a current can only reach the light-emitting layer 2 by first bypassing the current block layer 3A. Thus, the main light-emitting region of the light-emitting layer 2 is no longer situated right below the N-type electrode 9, so that the excited light shielded by the N-type electrode 9 is reduced to increase the light extraction efficiency.

However, the presence of the current block layer 3A leads to increased resistance that reduces light-emitting efficiency of the LED. Further, a transmission speed of a horizontal current is greater than that of a vertical current. When the current block layer 3A is utilized for guiding the current not to pass through the light-emitting layer 2 right below the N-type electrode 9, the light-emitting layer 2 right below the N-type electrode 9 still has considerable brightness due to the transmission of the horizontal current. As a result, a substantial amount of light remains being shielded by the N-type electrode 9 to lead 5% to 20% loss. In conclusion, the light extraction efficiency is limited and fails to fulfill actual requirements.

In another conventional approach for increasing the light extraction efficiency, a thickness of an epitaxy layer is enlarged or a doping concentration is increased to improve a current transmission capability. Through the high current transmission capability, the area of the N-type electrode 9 can be reduced to further decrease a shielded region. However, regardless whether the thickness of the epitaxy layer is enlarged or the doping concentration is increased, a quality of the epitaxy is severely degraded. Further, a current density gets larger as the current increases, such that problems of a boosted forward voltage and burning the electrode are likely incurred.

In yet another conventional approach for increasing the light extraction efficiency, a reflection metal is disposed right below the N-type electrode 9 to reflect the excited light shielded by the N-type electrode 9. It should be noted that, in a vertical LED, as previously stated, the mirror layer 4 is already disposed below the P-type semiconductor layer 3. When the reflection metal is disposed right below the N-type electrode, the excited light is incessantly reflected between the reflection metal and the mirror layer 4 till the excited light is fully depleted. Consequently, the excited light is still not extracted, namely the light extraction efficiency cannot be increased.

SUMMARY OF THE INVENTION

Therefore, the primary object of the present invention is to provide a structure capable of increasing light extraction efficiency by guiding a projection of excited light.

A reflection curved mirror structure of a vertical light-emitting diode (LED) is provided according to one embodiment of the present invention. The reflection curved mirror structure is applied to an LED structure which comprises a P-type electrode, a permanent substrate, a binding layer, a buffer layer, a mirror layer, a P-type semiconductor layer, a light-emitting layer, an N-type semiconductor layer and an N-type electrode that are stacked in sequence. Between the P-type semiconductor layer and the mirror layer is a filler. The filler is made of a transparent material, and forms a protruding curved surface right below the N-type electrode. The protruding curved surface faces the light-emitting layer. The mirror layer forms a mirror structure along the protruding curved surface.

Thus, with the mirror structure of the present invention, when excited light generated by the light-emitting layer which is located right below the N-type electrode is emitted downwards, the excited light is reflected by the mirror structure towards two sides of the mirror structure. That is to say, by means of the mirror structure, the excited light generated by the light-emitting layer right below the N-type electrode can dodge the N-type electrode without being shielded, thereby increasing the light extraction efficiency.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Details of the present invention shall be described with preferred embodiments below. It should be noted that, the embodiments are illustrative examples for explaining the present invention and are not to be construed as limiting the present invention.

Figure 1:
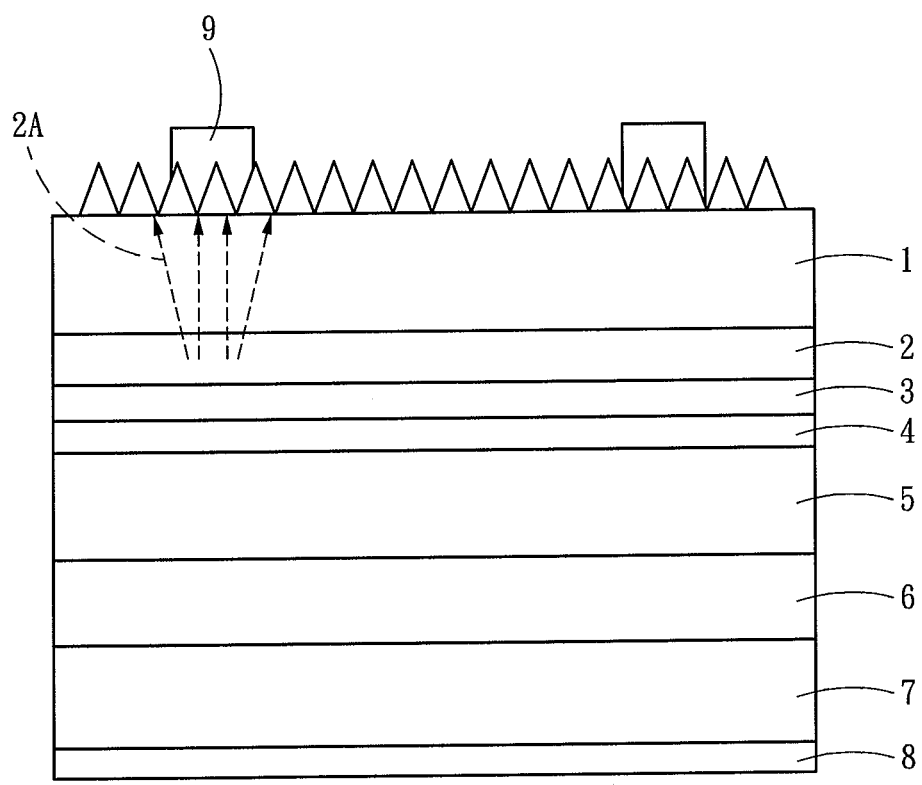
FIG. 1 is a diagram of a conventional LED.
Figure 2:
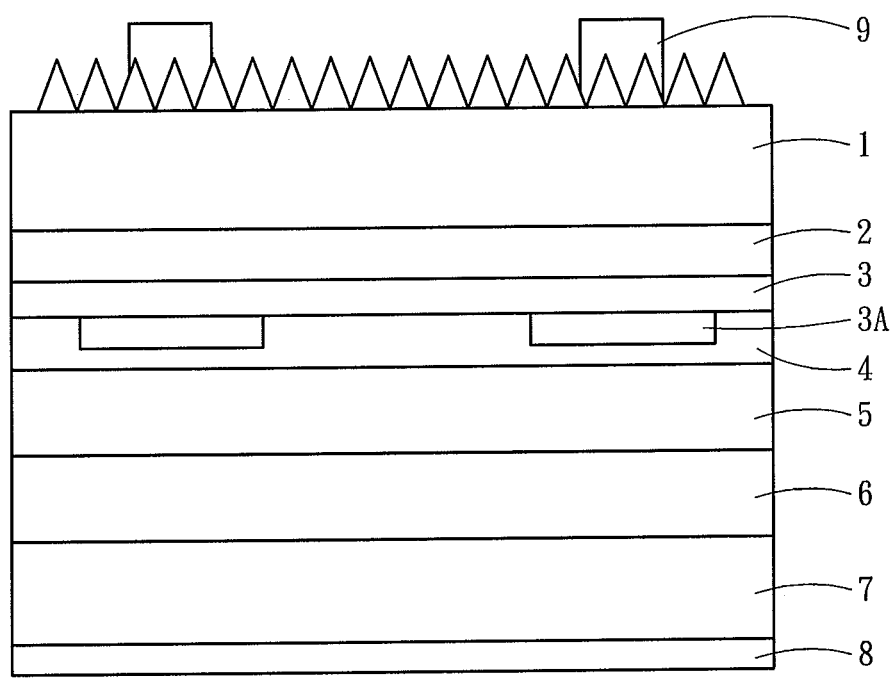
FIG. 2 is a diagram of another LED.
Figure 3:
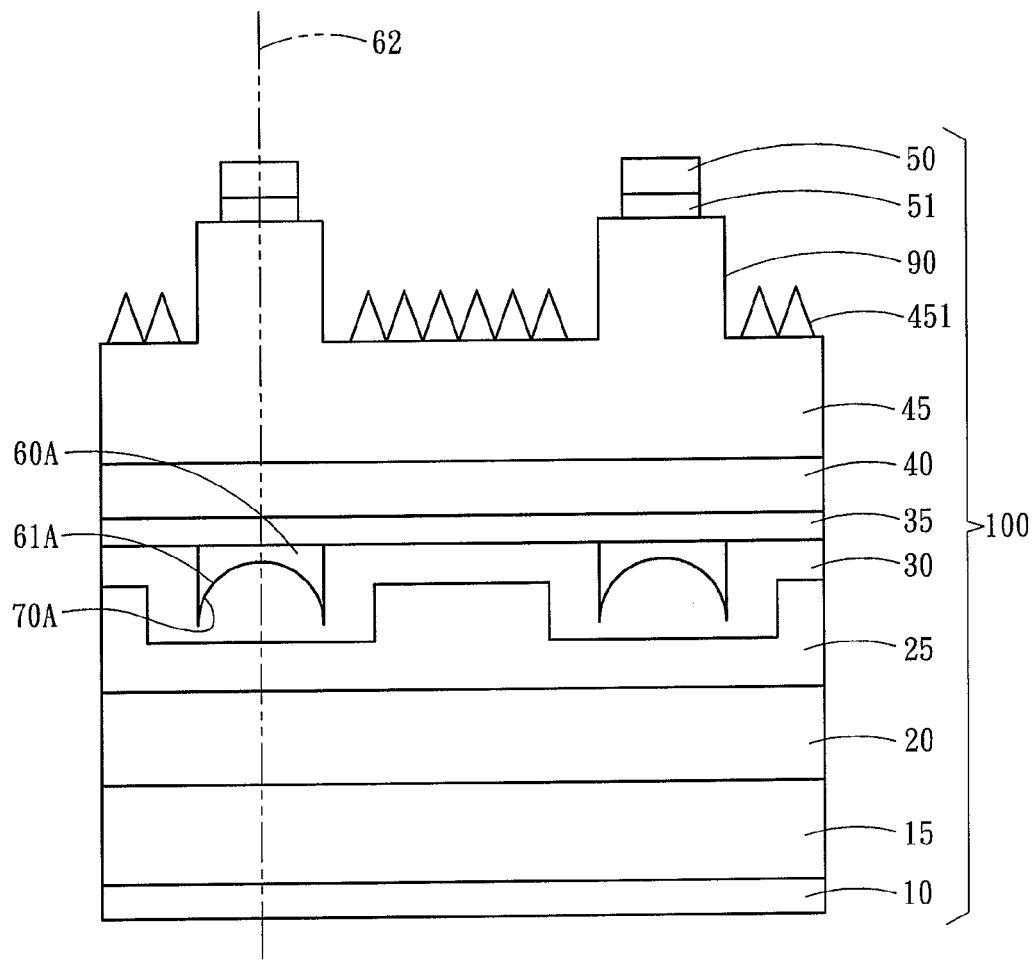
FIG. 3 is a diagram of a structure according to one embodiment of the present invention.

Referring to FIG. 3, a reflection curved mirror structure of a vertical light-emitting diode (LED) is provided according to one embodiment of the present invention. The reflection mirror structure is applied to an LED structure 100 which comprises a P-type electrode 10, a permanent substrate 15, a binding layer 20, a buffer layer 25, a mirror layer 30, a P-type semiconductor layer 35, a light-emitting layer 40, an N-type semiconductor layer 45 and an N-type electrode 50 that are stacked in sequence. At a region without the N-type electrode 50, the N-type semiconductor layer 45 has an irregular surface 451. The irregular surface 451 is for preventing total reflection and increasing light extraction efficiency. For example, the irregular surface 451 is formed by a physical approach such as being formed by plasma impact or being formed by chemical etching.

Between the P-type semiconductor layer 35 and the mirror layer 30 is a filler 60A. The filler 60A is made of a transparent material, and may be selected from a group consisting of silicon dioxide ($SiO_2$), titanium dioxide ($TiO_2$), silicon nitride (SiN), indium tin oxide (ITO), zinc gallium oxide (GZO), P-type gallium nitride (P—GaN), and highly-doped N-type gallium nitride ($N^+$—GaN). The filler 60A is located right below the N-type electrode 50 and forms a protruding curved surface 61A. The protruding curved surface 61A faces the light-emitting layer 40. The mirror layer 30 forms a mirror structure 70A along the protruding curved surface 61A. Further, the mirror structure 70A may have a virtual symmetry line 62, which is spaced from a center of the N-type electrode 50 by a distance smaller than 10 μm.

Figure 4:
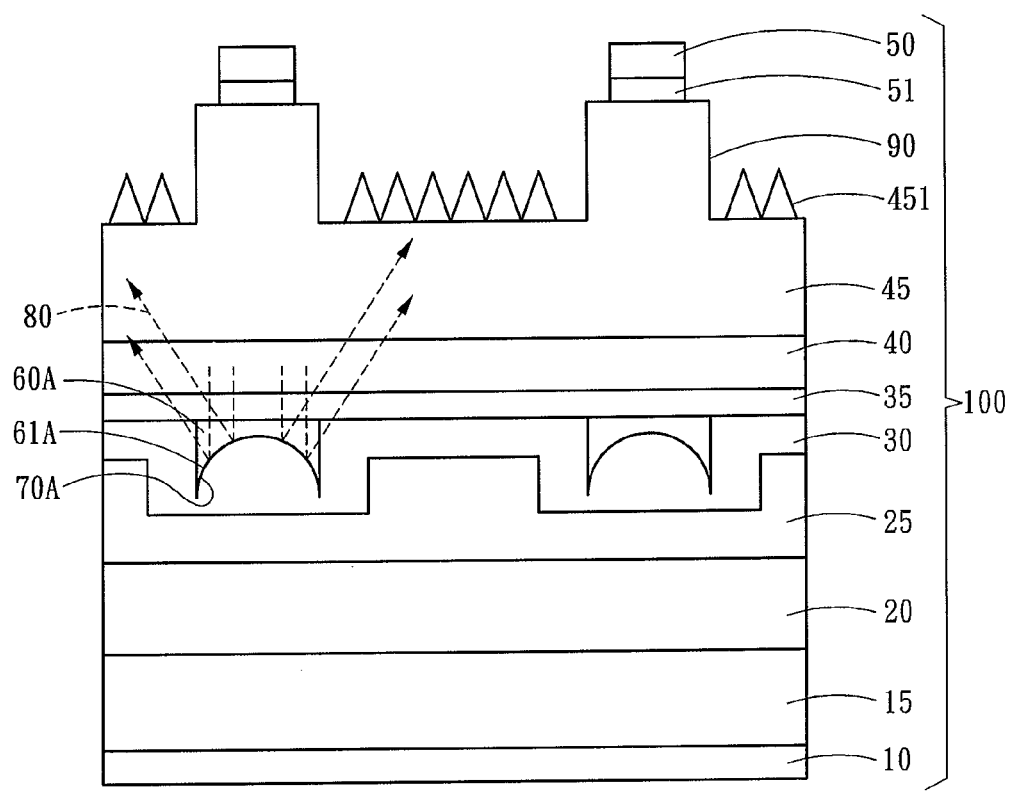
FIG. 4 is a schematic diagram of light guide according to one embodiment of the present invention.

Referring to FIG. 4, according to the above structure, when the light-emitting layer 40 generates excited light 80, the excited light 80 is vertically emitted downwards to the mirror structure 70A. Since the mirror structure 70A is adhered to the protruding curved surface 61A to have the same shape as the protruding curved surface 61A does, the excited light 80 can be reflected by the mirror structure 70A and projected towards two sides to dodge the N-type electrode 50, thereby increasing the light extraction efficiency.

Figure 5:
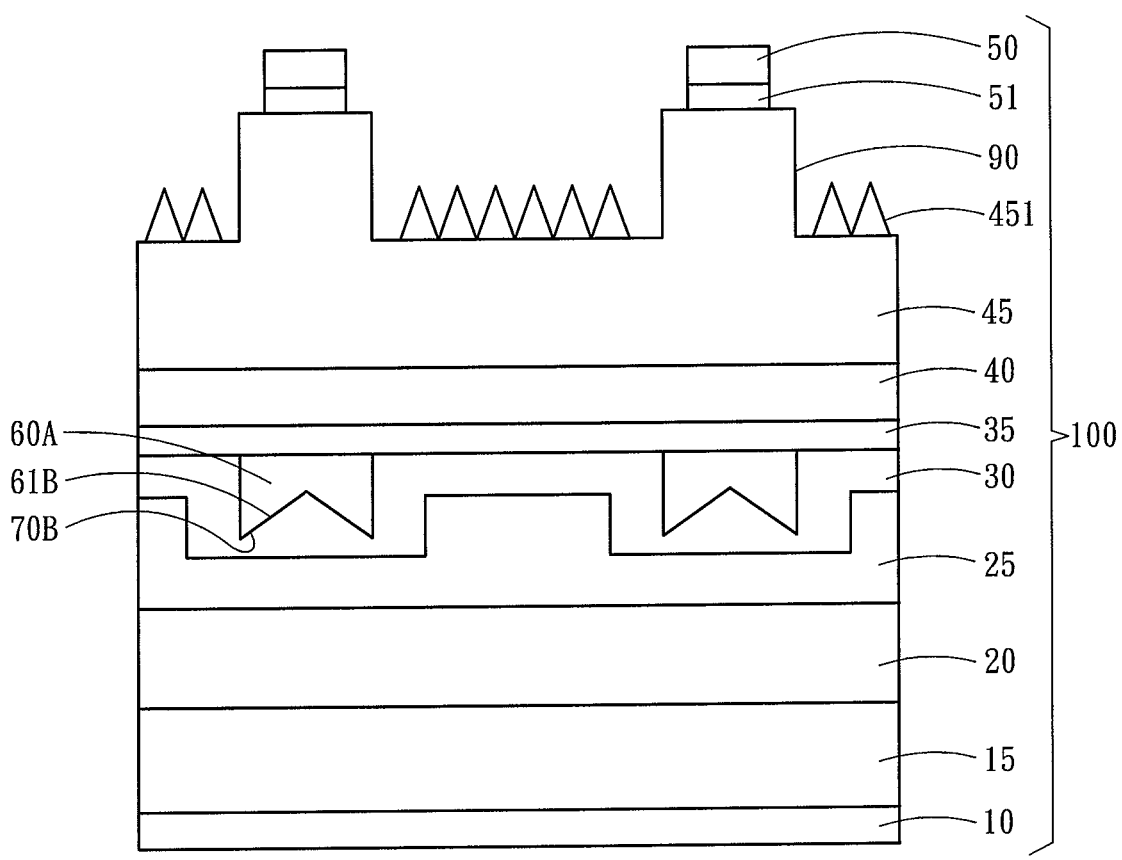
FIG. 5 is a diagram of a structure according to another embodiment of the present invention.

Referring to FIG. 5, in another embodiment of the present invention, a protruding curved surface 61B may also be formed by a triangular prism structure, and a mirror structure 70B has a shape corresponding to the protruding curved surface 61B, so as to be able to reflect the excited light 80 that projects downwards to the two sides.

Figure 6:
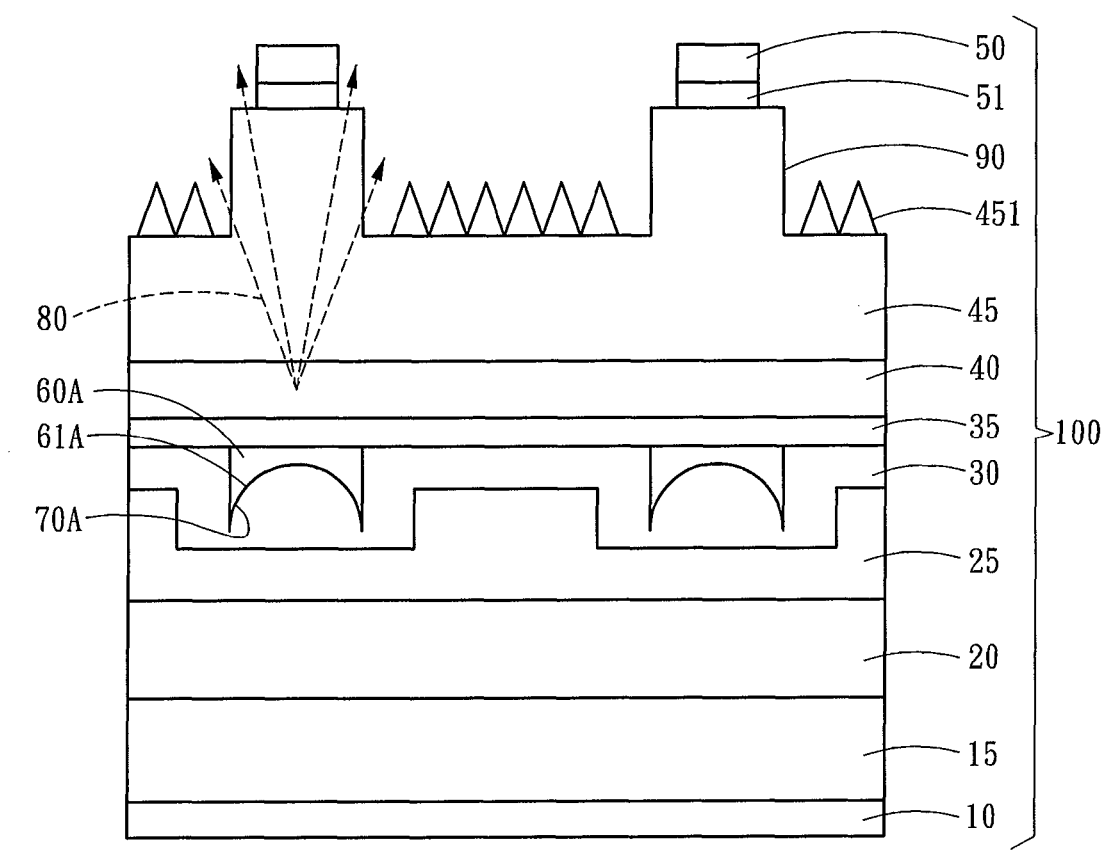
FIG. 6 is a schematic diagram of light guide according to another embodiment of the present invention.
Figure 8:
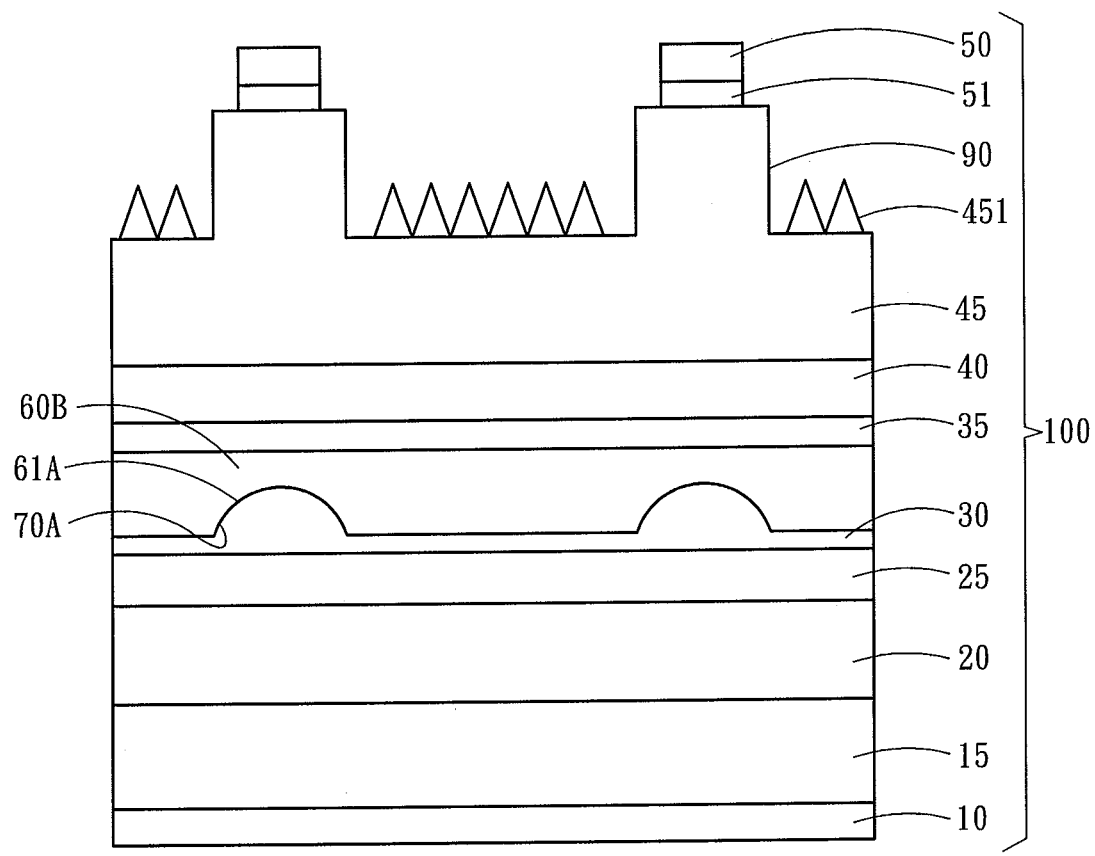
FIG. 8 is a diagram of a filler according to yet another embodiment of the present invention.

Referring to FIG. 6, the N-type semiconductor layer 45 may have an elevated platform 90 corresponding to the N-type electrode 50. Preferably, the elevated platform 90 is formed at a height between 0.5 μm and 3 μm. The N-type electrode 50 is disposed on the elevated platform 90 in an elevated manner. As shown in FIG. 8, the amount of the excited light 80 shielded by the N-type electrode 50 is significantly reduced, thus increasing the light extraction efficiency.

Figure 7:
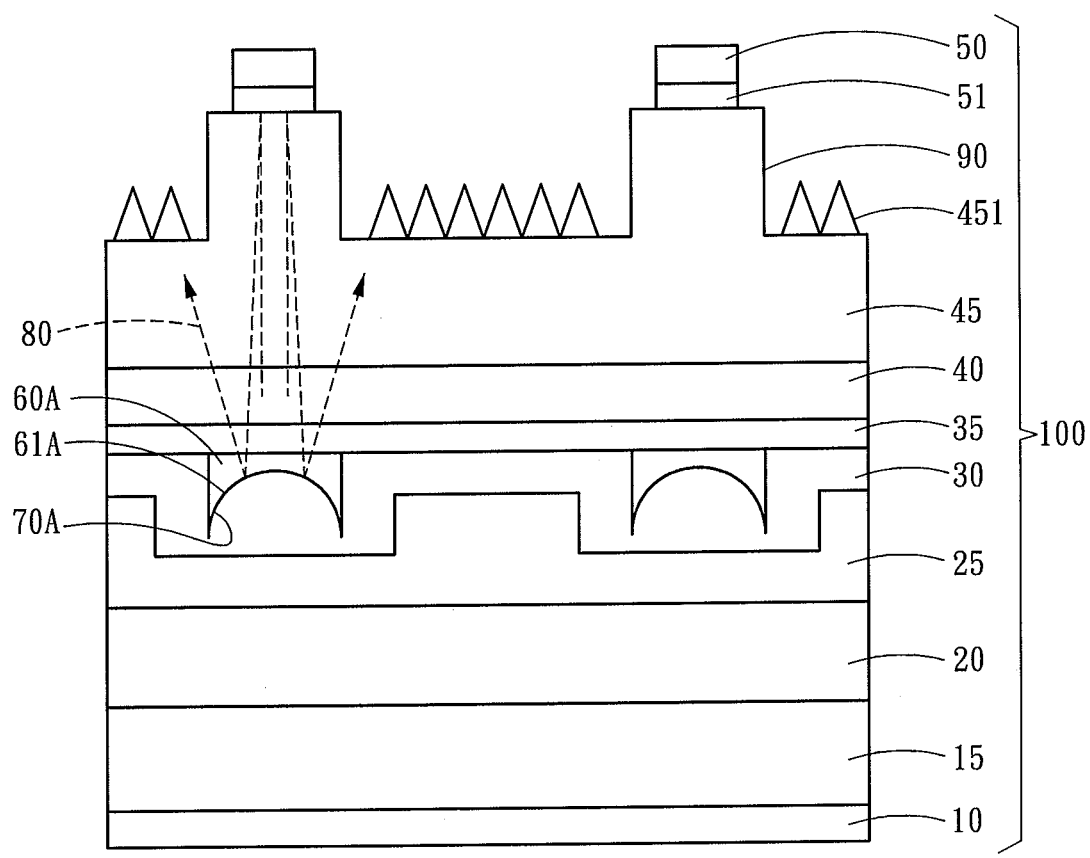
FIG. 7 is another schematic diagram of light guide according to another embodiment of the present invention.

Referring to FIG. 7, in an alternative embodiment of the present invention, an electrode mirror layer 51 is provided between the N-type electrode 50 and the N-type semiconductor layer 45. As shown in FIG. 9, the electrode mirror layer 51 reflects the excited light 80 emitted upwards by the light-emitting layer 40. After being reflected, the excited light 80 is projected downwards to the mirror structure 70A, and is then reflected outwards by the mirror structure 70A without being shielded by the N-type electrode 50, thereby increasing the light extraction efficiency.

FIG. 8 shows a filler according to another embodiment of the present invention. A main difference of a filler 60B is that, the filler 60B is made of a transparent conductive material, and is thoroughly distributed below the P-type semiconductor layer 35. For example, the filler 60B is formed under the P-type semiconductor layer 35 by a thin-film manufacturing process such as sputtering, vapor deposition, coating or monocrystalline epitaxial growth, and may be made of a material selected from a group consisting of ITO, GZO, P—GaN and highly-doped $N^+$—GaN.

Further, the mirror structures 70A and 70B may be made of a material selected from a group consisting of aluminum (Al), silver (Ag) and gold (Au) that all have high reflection rate and are commonly used as reflection material.

Thus, the excited light can be reflected by the mirror structure. When the excited light generated by the light-emitting layer which is located right below the N-type electrode is emitted downwards, the excited light is reflected by the mirror structure towards two sides. That is to say, by means of the mirror structure, the excited light generated by the light-emitting layer right below the N-type electrode can dodge the N-type electrode without being shielded, thereby increasing the light extraction efficiency. Further, as the N-type electrode is elevated and the electrode mirror layer is disposed between the N-type electrode and the N-type semiconductor layer, the light extraction efficiency is further increased to achieve the object of providing increasing light extraction efficiency.

What is claimed is:

1. A reflection curved mirror structure of a vertical light-emitting diode (LED) which comprises a P-type electrode, a permanent substrate, a binding layer, a buffer layer, a mirror layer, a P-type semiconductor layer, a light-emitting layer, an N-type semiconductor layer and an N-type electrode that are stacked in sequence, the curved mirror structure being characterized in that:

the P-type semiconductor layer and the mirror layer are interposed by a filler, the filler is made of a transparent material and forms a protruding curved surface right below the N-type electrode, the protruding curved surface faces the light-emitting layer, and the mirror layer forms a mirror structure along the protruding curved surface.

2. The reflection curved mirror structure of claim 1, wherein the mirror structure further comprises a symmetry line spaced from a center of the N-type electrode at a distance smaller than 10 μm.

3. The reflection curved mirror structure of claim 1, wherein the protruding curved surface is formed by a semi-cylindrical structure.

4. The reflection curved mirror structure of claim 1, wherein the protruding curved surface is formed by a triangular prism structure.

5. The reflection curved mirror structure of claim 1, wherein the N-type semiconductor layer comprises an elevated platform corresponding to the N-type electrode, and the N-type electrode is disposed on the elevated platform.

6. The reflection curved mirror structure of claim 5, wherein the elevated platform is formed at a height between 0.5 μm and 3 μm.

7. The reflection curved mirror structure of claim 1, wherein the N-type electrode and the N-type semiconductor layer are interposed by an electrode mirror layer.

8. The reflection curved mirror structure of claim 1, wherein the filler is made of a material selected from a group consisting of silicon dioxide ($SiO_2$), titanium dioxide ($TiO_2$), silicon nitride (SiN), indium tin oxide (ITO), zinc gallium oxide (GZO), P-type gallium nitride (P—GaN) and highly-doped N-type gallium nitride ($N^+$—GaN).

9. The reflection curved mirror structure of claim 1, wherein the mirror structure is made of a material selected from a group consisting of aluminum (Al), silver (Ag) and gold (Au).

10. The reflection curved mirror structure of claim 1, wherein the N-type semiconductor layer comprises an irregular surface where no N-type electrode is formed.

11. The reflection curved mirror structure of claim 1, wherein the filler is made of a transparent conductive material and is thoroughly distributed on the P-type semiconductor layer.

12. The reflection curved mirror structure of claim 11, wherein the filler is formed on the P-type semiconductor layer by a process of sputtering, vapor deposition, coating or monocrystalline epitaxial growth.

13. The reflection curved mirror structure of claim 11, wherein the filler is made of a material selected from a group consisting of indium tin oxide (ITO), zinc gallium oxide (GZO), P-type gallium nitride (P—GaN) and highly-doped N-type gallium nitride ($N^+$—GaN).

* * * * *